(12) United States Patent
Tseng

(10) Patent No.: US 6,204,526 B1
(45) Date of Patent: Mar. 20, 2001

(54) METHOD FOR FABRICATING A DRAM CELL WITH A CUP SHAPED STORAGE NODE

(75) Inventor: Horng-Huei Tseng, Hsinchu (TW)

(73) Assignee: Vanguard International Semiconductor Corporation, Hsin-Chu (TW)

( * ) Notice: Subject to any disclaimer, the term of this patent is extended or adjusted under 35 U.S.C. 154(b) by 608 days.

(21) Appl. No.: 08/720,645

(22) Filed: Oct. 2, 1996

Related U.S. Application Data

(62) Division of application No. 08/585,615, filed on Jan. 16, 1996, now Pat. No. 5,595,929.

(51) Int. Cl.$^7$ .................................................. H01L 29/76
(52) U.S. Cl. ............................................................ 257/296
(58) Field of Search ............................................... 257/298

(56) References Cited

U.S. PATENT DOCUMENTS 5,386,382 * 1/1995 Ahn ...................................... 257/298
5,447,882 9/1995 Kim ....................................... 437/60
5,539,231 * 7/1996 Suganaga et al. .................... 257/296

* cited by examiner

Primary Examiner—Stephen D. Meier
(74) Attorney, Agent, or Firm—George O. Saile; Stephen B. Ackerman; William J. Stoffel

(57) ABSTRACT

A method and resultant structure, is described for fabricating a DRAM cell having a cup-shaped capacitor connected to a MOS transistor with source and drain regions. A cylindrical bottom portion of a storage electrode is connected to and extends up from the source region of the transistor. The storage electrode has a solid cup shaped top portion over the bottom portion. The method comprises forming an interlayer insulating film over the MOS transistor and forming a photoresist layer with an opening over the source. The interlayer film is isotropically etched through the opening to form a cup shaped cavity. Next, the interlayer is anisotropically etch through the same photoresist opening to form a contact opening exposing the source. A polysilicon layer is formed filling the contact hole and the cup shaped cavity thereby forming a cup shaped storage electrode. The interlayer film is then removed. A capacitor dielectric and a top electrode are formed over the storage electrode to complete the cup shaped capacitors.

6 Claims, 5 Drawing Sheets

METHOD FOR FABRICATING A DRAM CELL WITH A CUP SHAPED STORAGE NODE

This application is a divisional of Ser. No. 08/585,615 filed Jan. 16, 1996, now U.S. Pat. No. 5,595,929.

BACKGROUND OF INVENTION

1) Field of the Invention

This invention relates generally to fabrication of capacitors in a dynamic random access memory (DRAM) cell and more particularly to a method and process for fabricating capacitors with a large capacitance.

2) Description of the Prior Art

In dynamic semiconductor memory storage devices, it is essential that storage node capacitor cell plates be large enough to retain an adequate voltage level in spite of parasitic capacitances and noise that may be present during circuit operation. As is the case for most semiconductor integrated circuitry, circuit density is continuing to increase at a fairly constant rate. The issue of maintaining storage node capacitances is particularly important as the density of DRAM cells continues to increase for future generations of memory devices. The ability to densely pack storage cells while maintaining required storage capacitance is a crucial requirement of semiconductor manufacturing technologies if future generations of expanded memory array devices are to be successfully manufactured.

One such circuit element experiencing electrical limitations is the array of storage cells on a dynamic random access memory (DRAM) chip. These individual DRAM storage cells, usually consisting of a single metal-oxide-semiconductor field-effect-transistor (MOS-FET) and a single capacitor, are used extensively in the electronic industry for storing data. A single DRAM cell stores a bit of data on the capacitor as electrical charge. The decrease in cell capacitance caused by reduced memory cell area is a serious obstacle to increasing packing density in dynamic random access memories (DRAMs). Thus, the problem of decreased cell capacitance must be solved to achieve higher packing density in a semiconductor memory device, since decreased cell capacitance degrades read-out capability and increases the soft error rate of memory cell as well as consumes excessive power during low-voltage operation by impeding device operation.

Generally, in a 64 MB DRAM having a 1.5 $\mu m^2$ memory cell area employing an ordinary two dimensional stacked capacitor cell, sufficient cell capacitance cannot be obtained even though a higher dielectric constant material, e.g., tantalum oxide ($Ta_2O_5$), is used. Therefore, stacked capacitors having a three-dimensional structure have been suggested to improve cell capacitance. Such stacked capacitors include, for example double-stacked, fin-structured, cylindrical, spread-stacked, and box structured capacitors. In order to increase the surface area of the capacitor, there have also been proposed methods of forming a capacitor with a pin structure extending throughout a multi-layer structure of the capacitor to connect the layers with one another, a method of forming a capacitor using a hemispherical grain polysilicon (HSG) process using polysilicon grains. Also, U.S. Pat. No. 5,447,882 (Kim) shows a related processes for forming a capacitor having a relatively high capacitance. However, many of the prior art methods require substantially more processing steps or/and planar structures which make the manufacturing process more complex and costly. Therefore, it is very desirable to develop processes that are as simple as possible.

There is a challenge to develop methods of manufacturing the high capacitance capacitors that minimize manufacturing costs and maximize the device yields. In particular, there is a challenge to develop a method which minimizes the number of photoresist masking operations and provides maximum process tolerance to maximize product yields.

SUMMARY OF THE INVENTION

It is an object of the present invention to provide a method for fabricating a cup shaped capacitor having a high capacitance which uses less photolithographic and etch steps than the conventional processes.

It is an object of the present invention to provide a method for fabricating a cup shaped capacitor having a high density and capacitance, and a self aligned node contact.

It is an object of the present invention to provide a method for fabricating a (DRAM) having capacitor with a high density and capacitance which defines the storage electrode using one mask and two etch steps.

To accomplish the above objectives, the present invention provides a method of manufacturing a cup shaped capacitor for a dynamic random access memory (DRAM) which uses a one masking step and a two step etch process to define the cup shaped storage electrode. Also, the contact node is self aligning. The method begins by providing a MOS (metal oxide semiconductor) device having a gate centered between spaced source and drain regions. An interlayer insulating film is formed over the MOS device and the substrate surface. A first photoresist layer is formed over the interlayer insulating film. The first photoresist layer has a first opening over the source. Next, the interlayer insulating film is isotropically etched through the first opening using the first photoresist layer as a mask forming a cup shaped cavity having sidewalls formed from the interlayer insulating film. Then, the interlayer insulating film is anisotropically etched through the first opening forming a contact hole which exposes the source. The first photoresist layer is then removed. A first conductive layer is then formed over the resulting structure and in the cup shaped cavity and in the node contact hole forming an electrical contact with the source. A top portion of the first conductive layer is removed so that the top surfaces of the first interlayer layer are exposed thus separating adjacent storage electrodes. The interlayer insulating film is removed by a selective etching process thereby forming a cup shaped storage node. Lastly, a dielectric layer and top plate electrode are formed over the bottom storage electrode. The method of defining the cup shaped storage electrode using one masking step and two etch steps produces a capacitor which is closely spaced and uses less masking and etch steps than conventional processes. The invention's one masking step which defines both the contact node and the storage electrode (i.e., aperture), is self aligning, and eliminates at least one mask step thereby making the process cheaper and increasing yields. The saving of one masking step translates into about a 5% savings (4 MB DRAM technology typically has a total of 22 masking layers).

DETAILED DESCRIPTION OF THE PREFERRED EMBODIMENTS

The present invention will be described in detail with reference to the accompanying drawings. The present invention provides a method of forming a DRAM having a cup shaped capacitor which has small dimensions, high capacitance and is simple to manufacture. First, the processes for forming the field oxide (FOX) and the field effect transistor structure as presently practiced in manufacturing DRAM cells are only briefly described in order to better understand the current invention. Next, the one masking/two etch step method to fabricate the cup shaped capacitor will be described in detail.

Figure 1:
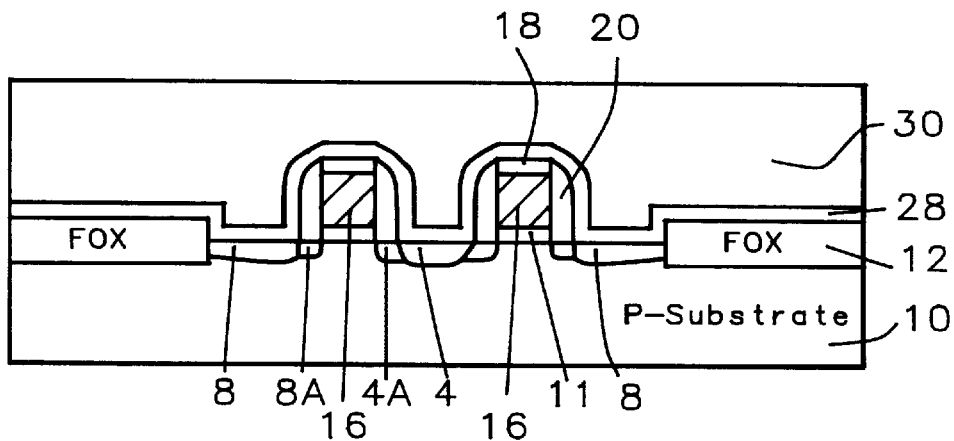
FIGS. 1 through 7 are cross sectional views for illustrating an embodiment of the method for manufacturing a DRAM having a cup shaped capacitor according to the present invention.

As shown in FIG. 1, the method begins by fabricating a capacitor in a substrate having a field oxide layer 12 and FET devices formed thereon. Field oxide layer 12 is formed on a semiconductor substrate 10 for defining active regions and isolation regions. The preferred substrate is composed of a P-type single crystal silicon having a (100) crystallographic orientation. A relatively thick field oxide (FOX) 12 is formed around the active device areas to electrically isolate these areas. One method of forming these regions is describe by E. Kooi in U.S. Pat. No. 3,970,486, wherein selected surface portions of a silicon substrate are masked against oxidation and the unmasked surface is oxidized to grow a thermal oxide which in effect sinks into the silicon surface at the unmasked areas. The mask is removed and semiconductor devices can be formed in the openings between the isolation regions. The preferred thickness of the field oxide is preferably in the range between about 3000 and 6000 Å.

An optional channel stop implant (not shown) can be formed either before or after FOX 12 formation by ion implanting boron at a concentration of between about 2E12 and 5E13 atoms/cm$^2$ and at an energy between about 120 and 180 Kev.

The semiconductor FET device is then formed in the active device area. The most commonly used device for dynamic random access memory (DRAM) is MOSFET. The formation of the field effect transistor show in FIG. 1 will be describe next. A gate oxide layer 11 is formed, typically by thermal oxidation of the silicon substrate to a thickness between about 80 and 160 Å. An appropriately doped polysilicon layer, and an insulating layer are deposited on substrate 10 and conventional photolithographic techniques are used to pattern these layers 11 16 18. As shown in FIG. 1, the gate electrodes 11 16 18 are formed on the substrate disposed between the field oxide regions 12. The gate on the substrate forms the gate electrode of the MOSFET in the active device areas. Gate electrodes formed over the field oxide (not shown) form word lines that electrically connect the MOSFET gate electrode to the appropriate peripheral circuits on the DRAM chip.

The lightly doped source/drain 4A 8A of the N-channel MOSFET is formed next, usually by implanting an N-type atomic species such as arsenic or phosphorus through the spaces between the gate electrodes 16 18. For example, a typical implant might consist of phosphorus P31 at a dose of between about 1E13 to 1E14 atoms/cm$^2$ and at an energy between about 30 to 80 Kev.

After forming the lightly doped source/drains 8 A 4A, sidewall spacers 20 are formed on the gate electrode 16 18 sidewalls. These sidewall spacers 20 are preferably formed by depositing a low temperature silicon oxide and anisotropically etching back to the silicon surface. For example, the silicon oxide could be formed by a chemical vapor deposition using tetraethoxysilane (TEOS) at a temperature in the range of about 650° to 900° C. and the etch back performed in a low pressure reactive ion etcher with a fluorine gas such as $C_2F_6$ (carbon hexafluoride) or $CF_4+H_2$ (carbon tetrafluoride and hydrogen).

The source 8/drain 4 regions of the MOSFET are now implanted between the spacers with a N type atomic species, for example, arsenic (As75), to complete the source/drain (i.e., the source is the node contact) 8 4. The implantation is usually done through a thin layer of silicon oxide of about 200 to 300 Å in thickness to minimize implant channeling and to protect against contamination by metals and other impurities. A typical implantation dose being between 2E15 to 1E16 atoms/cm$^2$ and an energy of between about 20 to 70 Kev.

The remainder of this embodiment relates more specifically to those objects of the invention, which relate to the formation of the storage capacitor having a smaller size, an increased capacitance, and also providing a more manufacturable process.

As shown in FIG. 1, a first conformal insulation layer 28 is formed over the substrate surface and contacts the source and drain areas 8 4. The conformal insulating layer 28 is preferably formed of silicon nitride. Layer 28 preferably has a thickness in the range between about 300 and 1000 Å and more preferably about 500 Å.

Still referring to FIG. 1, an interlayer insulating film 30 is formed over the substrate surface. The interlayer insulating film 30 can be formed of a doped oxide, P-doped silicon oxide (phosphosilicate glass), boron-doped silicon oxide, borophosphosilicate glass (BPSG), and silicon oxide. The interlayer insulating film 30 is preferably formed of Borophosphosilicate glass (BPSG). The interlayer insulating film 30 preferably has a thickness in the range of between about 5000 and 12,000 Å.

The interlayer insulating film 30 is preferably chemically mechanically polished (CMP). The wafer (and interlayer insulating film) is subjected to a chemical mechanical polishing technique which is conducted to at least the point of stopping at the upper surface of layer 30. An example slurry would be the SCI slurry, available from Roden Products Corporation of Newark, Del. USA. Such slurry comprises KOH, $SiO_2$ particles and water. A typical CMP polish time would be from about 1 to 2 minutes. Any residual slurry left on the wafer surface would be removed by a conventional wet cleaning technique. Alternatively, other planarizing techniques can be used, such as reflowing a doped oxide. The thickness of layer 30 determines the height of the lower cylindrical portion of the storage electrode, which effects the cell's capacitance.

Figure 2:
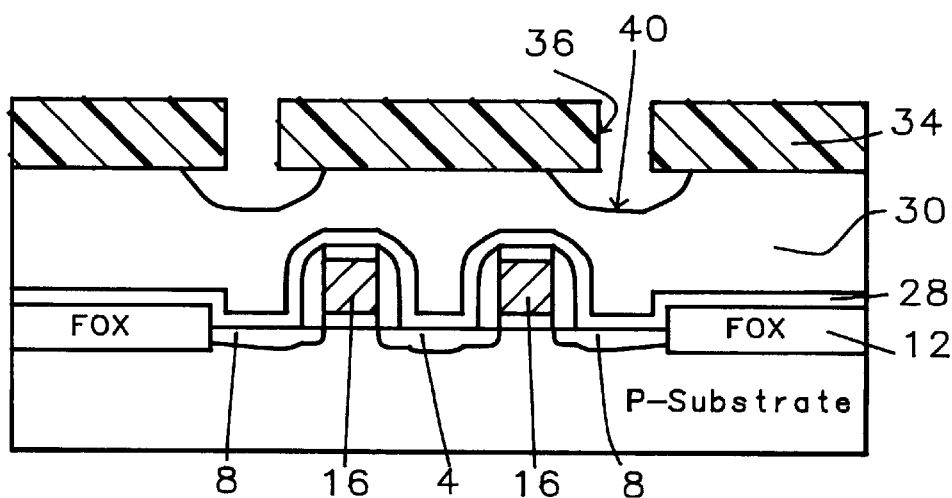

As shown in FIG. 2, a first photoresist pattern 34 having a first opening 36 over the source 8 is formed over the interlayer film 30. The first opening can have any shape, such as a circular or rectangular shape. The first opening is preferably centered over the source region 8.

As shown in FIG. 2, the interlayer insulation film 30 is isotropically etched through the first opening 36 in the resist layer 34. The isotropic etch forms a cup shaped cavity 40 having sidewalls of the interlayer insulating film. The hemispherical (cup) shaped cavity has a roughly hemispherical cross sectional shape created by the isotropic etch through the first opening 36 as shown in FIG. 2 The cavity could also be describe as having arced sides. The isotropic etch is preferably performed with a fluorine based gas plasma to remove a thickness (radius)of the interlayer insulating film in the range of between about 500 and 3000 Å.

Figure 3:
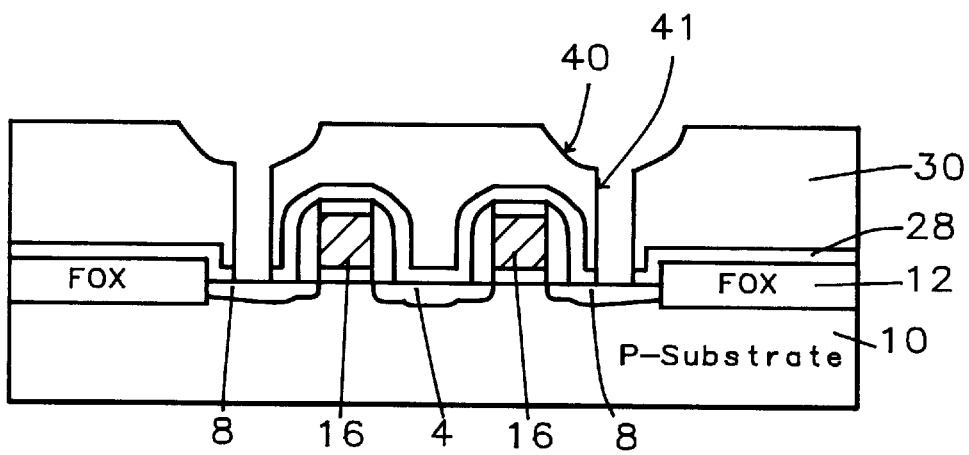

Referring to FIG. 3, in the second etch, the interlayer insulation film 30 and the first insulation layer 28 are anisotropically etched through the first opening 36 forming contact hole 41 thereby exposing the source 8. The anisotropic etch preferably has about the same etch rate for the first insulation layer 28 and the interlayer insulating film 30. For example, a silicon oxide interlayer film 30 could be etched back in a low pressure reactive ion etcher with a fluorine gas, such as $C_2F_6$ (carbon hexafluoride) or $CF_4+H_2$ (carbon tetrafluoride and hydrogen). The anisotropic etch is preferably a reactive ion etch using fluorine base gas plasma. A rainbow 4500, manufactured by Lam Research Company, may be used for this etch. The first photoresist layer 34 is then removed.

Figure 4:
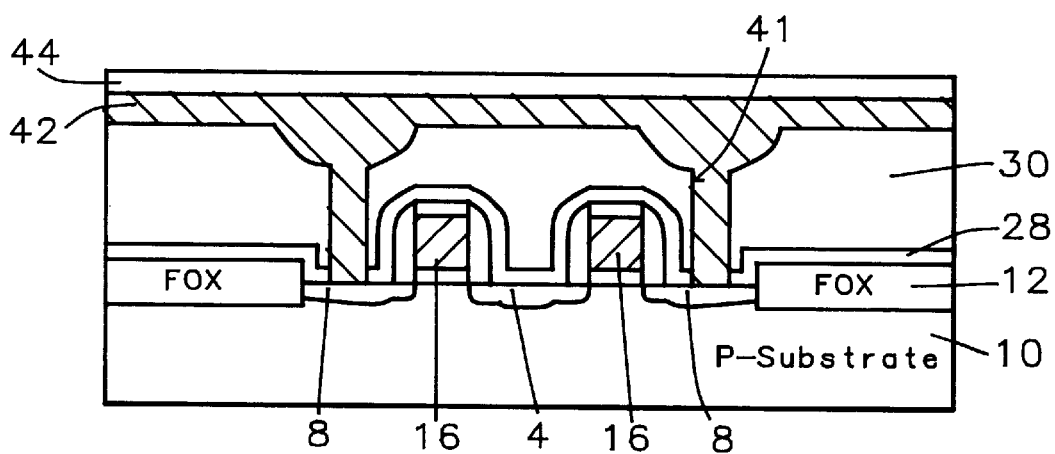
Figure 8:
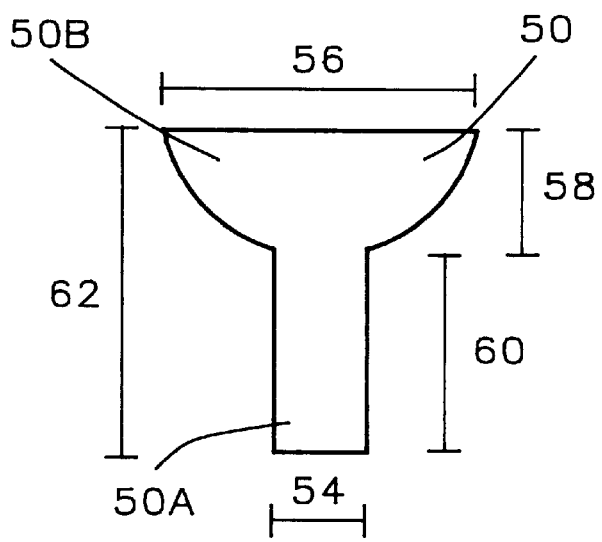
FIG. 8 is a side view of the cup shaped capacitor of the present invention.
Figure 9:
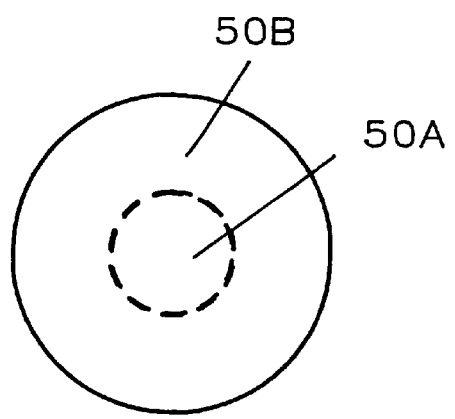
FIG. 9 is a top down view of the cup shaped capacitor of the present invention.

As shown in FIG. 4, a first conductive layer 42 is formed over the interlayer film 30, in the cup shaped cavity 40 and in the node contact hole 42 forming an electrical contact with the source 8. The first conductive layer filling the hemispherical (cup) shaped cavity 40 forms an upper portion 50B of the storage electrode. The first conductive layer fills the node contact hole 42 forming an upright lower cylindrical portion 50A of the storage electrode 50. As shown in FIGS. 4, 8 and 9, the upper portion 50B has an outer hemispherical cross sectional shape that is arced on the sides. The upper portion 50B has a hemispherical shape. The upper portion is shaped similar to an English tea cup.

The first conductive layer is preferably formed of polysilicon doped with an impurity selected from the group consisting of: phosphorus, and arsenic; and has an impurity concentration in the range of between about 1E20 and 1E22 atoms/cm$^3$. The first conductive layer has a thickness over the top surface of the interlayer film 30 in the range of between about 1000 and 3000 Å. The first conductive layer of polysilicon can be deposited by LPCVD (low pressure chemical vapor deposition). This layer can be doped by ion implanting with phosphorous or arsenic ions at a dosage between about 5E15 and 2E16 atoms/sq-cm and an energy of between about 20 and 60 Kev. Alternately, the polysilicon layer may be doped in situ. in a LPCVD process with phosphorus oxychloride (POCl$_3$) at a temperature of between about 875 and 900° C., for between about 30 and 50 minutes.

Next, a top portion of the first conductive layer 42 is removed so that the top surfaces of the interlayer insulating film 30 are exposed. This can be accomplished using several methods. First, the top portion can be removed by anisotropically etching the first conductive layer till the top surface of the interlayer insulating layer is exposed.

Preferably, the first conductive layer is removed by forming a silicide layer on the first conductive layer and etching away the silicide layer to expose the top surface of the interlayer film. To accomplish this, a refractory metal layer 44, is deposited over the first conductive layer as shown in FIG. 4. The refectory metal layer can be Ta, or Ti; and is preferably Ti. The refractory metal layer preferably has a thickness in the range of between about 600 and 1600 Å. Next, the substrate is heated to form a silicide layer 46 (preferably TiSix) over the first conductive layer. The substrate is preferably heated at a temperature of about 700° C.

Figure 5:
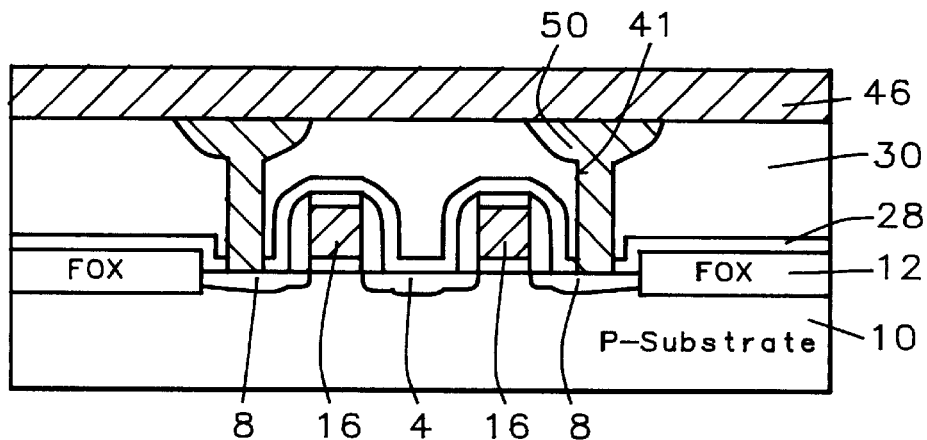
Figure 6:
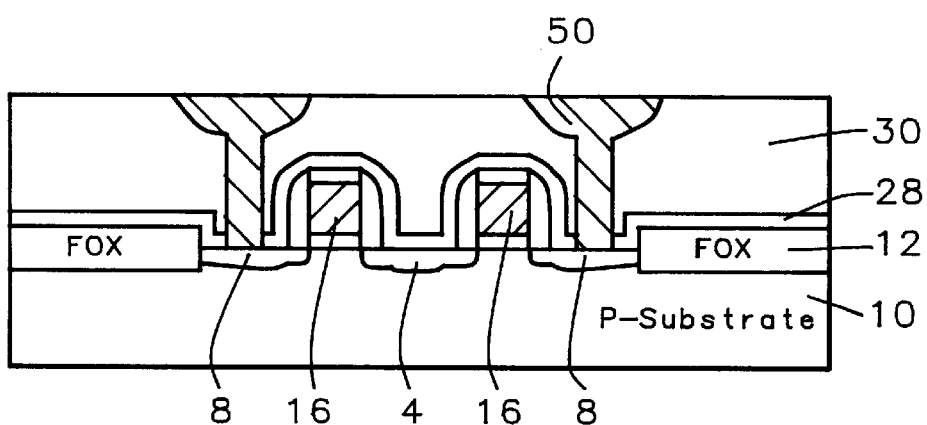

As shown in FIG. 5, the silicide layer 46 consumes a thickness of the first conductive layer 42 to a depth about even with the top surface of the interlayer insulating film 30. As shown in FIG. 6, the silicide layer 46 is selectively etched thereby planarizing the resultant surface so that the top surfaces of the first polysilicon layer 42 and the interlayer insulating film 30 are about even. This levels the top surfaces of the electrodes 50 and separates adjacent electrodes.

Figure 7:
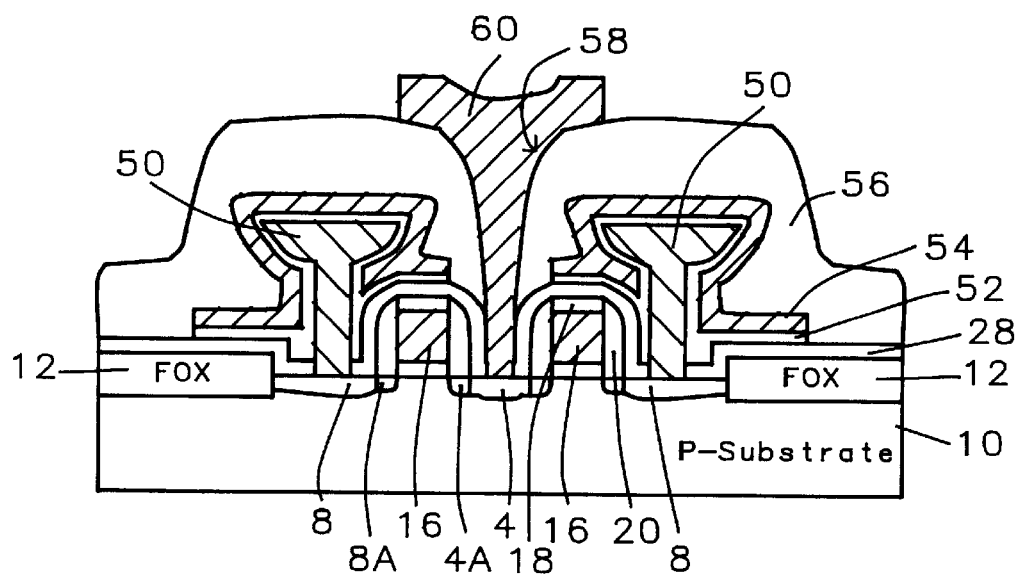

Turning to FIG. 7, the interlayer insulating film 30 is removed by a selective etch thereby forming the cup shaped storage node 50. The selective etch is preferably by a diluted HF etch.

Next, a capacitor dielectric layer 52 is formed over the first electrode 50 as shown in FIG. 7. The material of the dielectric layer 52 can be any suitable materiel having a high dielectric constant and being continuous and pinhole free. The conformal dielectric layer 52 can be formed of silicon nitride, an oxide/nitride/oxide (ONO) film, tantalum pentoxide (Ta$_2$O$_5$), and silicon oxide material. Preferably, the conformal dielectric layer is formed of ONO. The conformal dielectric layer 46 preferably has at thickness in the range between about 10 and 100 Å.

A top electrode 54 is formed over the capacitor dielectric layer as shown in FIG. 7. This is accomplished by forming a conductive layer over the substrate surface. The conductive layer and the underlying capacitor dielectric layer 52 is masked and etched, using conventional photolithographic techniques, to form the top plate electrode 54 as shown in FIG. 7. The top electrode 54 has a thickness in the range between about 1000 and 2000 Å. The top plate electrode is preferably formed a with polycrystalline silicon doped with an impurity. The top plate electrode 54 can have an impurity concentration in the range of between about 1E20 to 1E22 atoms/cm$^3$.

As shown in FIG. 7, a second insulation layer 56 is formed over the resulting structure. Second insulation layer 56 is preferably formed of undoped silicon oxide or a doped silicon oxide. The second insulation layer 56 can be formed of two layers: an undoped oxide and a planarization layer, such as BPSG.

The structure of the cup shaped capacitor for a DRAM cell is describe next. As shown in FIGS. 8 and 9, the storage electrode 50 has an upright solid lower cylindrical portion 50B and a cup shaped upper portion 50B. The upright lower cylindrical portion is in electrical contact with a source region in a substrate. The cup shaped upper portion 50 B is centered over the cylindrical lower portion 50A. The first conductive layer filling the hemispherical (cup) shaped cavity 40 forms the upper portion 50B of the storage electrode. The first conductive layer filling the node contact hole 42 forms the upright lower cylindrical portion 50A of the storage electrode 50. As shown in FIGS. 4, 8 and 9, the upper portion 50B has an outer hemispherical cross sectional shape that is arced on the sides.

The upright lower cylindrical portion 50A preferably has a diameter 54 in the range of between about 1000 and 3000 Å and a height 60 in the range of between about 3000 and 10,000 Å. The cup shaped upper portion 50B has a bottom end adjacent to the upright lower cylindrical portion and a top end. The bottom end preferably has a diameter 54 in the range of between about 1000 and 3000 Å; the top end preferably has a diameter 56 in the range of between about 2000 and 5000 Å and the cup shaped upper portion preferably has a height 58 in the range of between about 1000 and 3000 Å. The storage electrode 50 preferably has an overall height in the range of between about 5000 and 12000 Å. The storage electrode 50 is preferably formed of polysilicon doped with an impurity concentration in the range of between about 1E20 and 1E22 atoms/cm$^3$.

The method of defining the storage electrode using just one masking step and two etch steps produces a cup shaped capacitor which is closely spaced and uses less masking and etch steps than conventional processes. The invention's one masking step, which defines both the contact node and the storage electrode (i.e., aperture), eliminates at least one masking step thereby making the process cheaper and increasing yields. Also, the process is self aligning for the node contact thereby providing additional accuracy (e.g., process tolerance) and allowing the capacitors to be closely spaced to maximize the capacitance per unit area.

It should be will understood by one skilled in the art that by including additional process steps not described in this embodiment, other types of devices can also be included on the DRAM chip. For example, P wells in the P substrate and CMOS circuit can be formed therefrom. It should also be understood that the figures depict only one DRAM storage cell out of a multitude of cells that are fabricated simultaneously on the substrate. Also, the capacitor can be used in other chip types in addition to DRAM chips.

While the invention has been particularly shown and described with reference to the preferred embodiments thereof, it will be understood by those skilled in the art that various changes in form and details may be made without departing from the spirit and scope of the invention.

What is claimed is:

1. A capacitor for a DRAM cell on a semiconductor substrate; said semiconductor substrate having a MOS transistor with a source region and a drain region; comprising:
    a storage electrode having an upright lower cylindrical portion and a hemispherical shaped upper portion; said hemispherical shaped upper portion having a hemispherical cross-sectional shape and a solid inside; said upright lower cylindrical portion in electrical contact with said source region in said substrate; said hemispherical shaped upper portion centered over said cylindrical lower portion; a capacitor dielectric layer and a top electrode covering said storage electrode.

2. The capacitor of claim 1 wherein said upright lower cylindrical portion has a diameter in the range of between about 1000 and 3000 Å and a height in the range of between about 3000 and 10,000 Å.

3. The capacitor of claim 1 wherein said hemispherical shaped upper portion has a bottom end adjacent to said upright lower cylindrical portion and a top end; said bottom end having a diameter in the range of between about 1000 and 3000 Å; said top end having a diameter in the range of between about 2000 and 5000 Å and said hemispherical shaped upper portion having a height in the range of between about 1000 and 3000 Å.

4. The capacitor of claim 1 wherein said storage electrode has an overall height in the range of between about 5000 and 12,000 Å.

5. The capacitor of claim 1 wherein said storage electrode is formed of polysilicon doped with an impurity concentration in the range of between about 1E20 and 1E22 atoms/cm$^3$.

6. A capacitor for a DRAM cell on a semiconductor substrate; said semiconductor substrate having a MOS transistor with a source region and a drain region; comprising:
    a storage electrode having an upright lower cylindrical portion and a hemispherical shaped upper portion; said hemispherical shaped upper portion having a hemispherical cross-sectional shape and a solid inside; said upright lower cylindrical portion in electrical contact with said source region in said substrate; said hemispherical shaped upper portion centered over said cylindrical lower portion;
    said hemispherical shaped upper portion has a bottom end adjacent to said upright lower cylindrical portion and a top end; said bottom end having a diameter in the range of between about 1000 and 3000 Å; said top end having a diameter in the range of between about 2000 and 5000 Å and said hemispherical shaped upper portion having a height in the range of between about 1000 and 3000 Å;
    said storage electrode is formed of polysilicon doped with an impurity concentration in the range of between about 1E20 and 1E22 atoms/cm$^3$; and
    a capacitor dielectric layer and a top electrode covering said storage electrode.

* * * * *